United States Patent

[11] 3,624,536

[72] Inventor David E. Norton
Framingham, Mass.
[21] Appl. No. 814,105
[22] Filed Apr. 7, 1969
[45] Patented Nov. 30, 1971
[73] Assignee Adams-Russell Co. Inc.
Waltham, Mass.

[54] HIGH-DYNAMIC-RANGE AMPLIFIER
7 Claims, 6 Drawing Figs.

[52] U.S. Cl. .......... 330/53, 330/12, 330/68
[51] Int. Cl. .......... H03f 3/60
[50] Field of Search .......... 333/10, 24.2; 330/53, 31

[56] References Cited

UNITED STATES PATENTS

| | | | |
|---|---|---|---|
| 3,219,941 | 11/1965 | Engelbrecht .......... | 333/24.2 X |
| 3,371,284 | 2/1968 | Engelbrecht .......... | 333/10 X |
| 3,426,298 | 2/1969 | Sontheimer et al. .......... | 333/10 |
| 3,474,348 | 10/1969 | Cohen .......... | 330/53 |

*Primary Examiner*—Nathan Kaufman
*Attorney*—Kenway, Jenney & Hildreth

ABSTRACT: An amplifier for amplifying radiofrequency signals having a low-noise figure and the ability to handle relatively large amounts of power with low distortion. The high-dynamic-range amplifier comprises a dual directional coupler, having two ports coupled to the signal source and load and two ports coupled to an inverting amplifier, in which the input and output impedances of the amplifier are equal and are equal to the characteristic impedance of the source and load.

INVENTOR.
DAVID E. NORTON
BY
Kenway, Jenney & Hildreth

INVENTOR.
DAVID E. NORTON
BY
Kenway, Jenney & Hildreth

HIGH-DYNAMIC-RANGE AMPLIFIER

BACKGROUND OF THE INVENTION

My invention relates to electronic circuits, and particularly to a novel high-dynamic-range amplifier for use in amplifying radiofrequency signals.

There has existed continuing need for a high-dynamic-range radiofrequency amplifier. For example, in a system comprising a transmission line connected between a receiving array and a power divider coupling a group of receiving circuits to the array, the noise figure at any one receiver is increased because of the use of the power divider. Specifically, an *n*-way power divider increases the noise figure at any one receiver input by *n* as compared to a system without a power divider. It would be highly desirable to include an amplifier in the transmission line between the receiving antenna array and the power divider to increase the signal level sufficiently that the noise figure at any receiver input would be primarily determined by the noise figure of the amplifier. However, there are a number of requirements on such an amplifier that have made it difficult to construct an efficient and practical circuit. Specifically, while conventional amplifiers have widely different input and output impedances, the input and output impedance of a radiofrequency amplifier for use with a transmission line should be the same as the characteristic impedance of the line. The amplifier should operate linearly over a wide frequency range, but should not saturate in the presence of large signals. In conventional radiofrequency amplifiers and particularly those of the common emitter-type heretofore available, if the amplifier was designed to provide wide dynamic range, the amplifier noise figure would be high, while if the amplifier was designed for low-noise figure, it tended to have restricted signal-handling capability. These results came about because of the resistive feedback networks which were used in conjunction with the amplifiers.

In amplifiers of my invention, I have provided a construction characterized by large signal-handling capability and low-noise figure by using a nondissipative feedback network.

It is therefore a principal object of my invention to provide a radiofrequency amplifier having high-dynamic-range and at the same time a relatively low-noise figure. It is also an object of my invention to provide an amplifier of the type described having input and output impedances which are matched to the source and load impedances, particularly when the source and load are transmission lines.

Briefly, the objects of my invention are attained by an amplifying circuit incorporating an inverting amplifier having equal input and output impedances that is coupled to the source and the load through a four port directional coupler. The signal source is connected to one port of the directional coupler that is isolated from a second port, and the load is connected to a third port of the directional coupler that is isolated from a fourth port. The amplifier is an inverting amplifier that has an input terminal connected to the fourth port and an output terminal connected to the second port. Nondissipative feedback between input and output terminals of the inverting amplifier is provided by the directional coupler.

The manner in which the amplifying circuit of my invention is preferably constructed, and its mode of operation, will best be understood in the light of the following description, together with the accompanying drawings, of various illustrative embodiments thereof.

Figure 1:
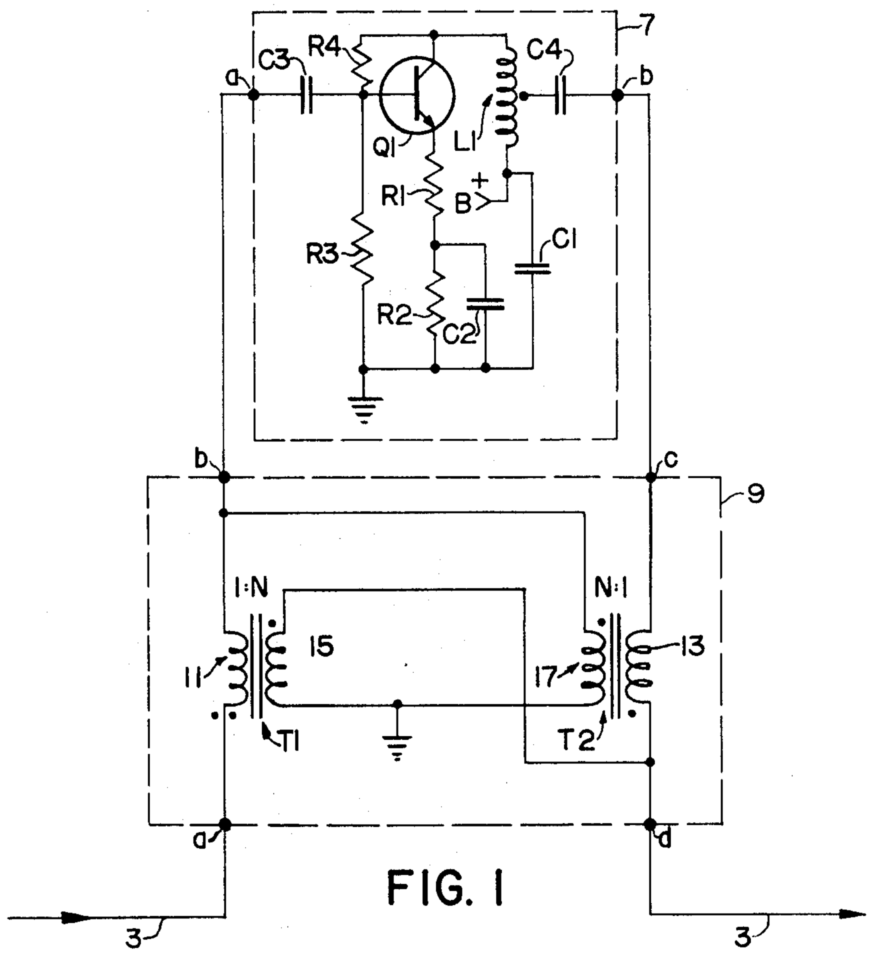
FIG. 1 is a schematic diagram of one embodiment of the amplifier of my invention.

As shown in FIG. 1, the radiofrequency amplifier of my invention includes an inverting amplifier generally indicated at 7 and a four port directional coupler, generally indicated at 9 which provides the feedback network for the inverting amplifier 7 and also couples the amplifier circuit to the source and the load.

The directional coupler 9 is provided with four ports, *a*, *b*, *c* and *d*. The port *a* is isolated from the port *c*, and is closely coupled to the port *b* with a phase angle of 0° relative to the phase at port *a*. Port *a* is coupled to port *d* with a fixed coupling ratio determined by the characteristics of the directional coupler, and a phase angle of 180°. Similarly, port *d* is isolated from port *b*, and is coupled to ports *c* and *a* with phase shifts of 0° and 180°, respectively, with the same coupling ratios as those given above. The amplified signal appearing at port *c* will be coupled to port *b* without phase shift; since the amplifier 7 provides inversion, the coupler serves as a degenerative feedback network for the amplifier.

It is a requirement of a conventional dual direction coupler that the ports must be terminated in equal matching impedances. Thus, if the source and load have a characteristic impedance Z, both the input and output impedances of the amplifier 7 must be equal to Z.

The dual directional coupler 9 of FIG. 1 is formed by a pair of identical, interconnected transformers T1 and T2. The transformer T1 has a primary winding 11 connected in series with the ports *a* and *b* of the directional coupler. The transformer T2 has a primary winding 13 connected in series with the ports *c* and *d* of the directional coupler.

The transformer T1 has a secondary winding 15 connected between port *d* and ground. Similarly, the transformer T2 has a winding 17 connected between port *b* and ground.

The transformers T1 and T2 are unity coupled transformers whose voltage and current relationships are determined by their turns ratio. In a practical embodiment of a directional coupler useful with an amplifier designed for the 2 to 32 MHz. range, the windings such as 15 and 17 comprised five turns of No. 34 Soldereze wire wound on a Ferroxcube 4A, No. 56–590–65 bead, and the windings such as 11 and 13 comprised a short length of No. 20 bus wire through the center of the bead giving a 5:1 turns ratio.

When each of the ports *a*, *b*, *c* and *d* are terminated in the same impedance, the directional coupler 9 functions as a matched dual directional coupler. As an example, if the ports *b* and *c* are terminated in the characteristic impedance of the directional coupler, e.g., 50 ohms, then the ports *a* and *d* will present the same characteristic impedance to the source and load respectively. When the coupler is thus matched, the port *a* is isolated from the port *c*, is essentially directly coupled to the port *b* with a phase shaft of 0°, and is coupled to the port *d* with a coupling ratio dependent on the turns ratio of the transformers and with a phase shift of 180°. For example, with the transformer construction described above, the power coupled from port *a* to port *d* was down about 14 db. over the entire frequency range of interest, whereas the power coupled to port *b* was down about 0.3 db.

Figure 2:
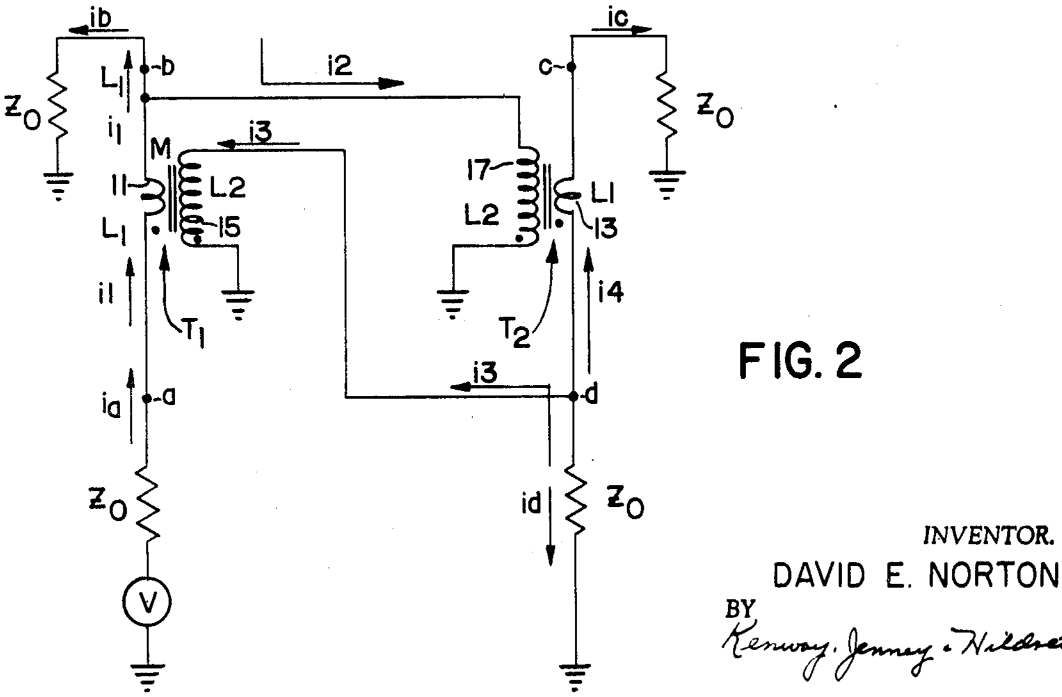
FIG. 2 is a schematic diagram of a dual directional coupler forming a part of the circuit of FIG. 1, labeled to facilitate the explanation of its mode of operation.

While the directional coupler per se is known in the art, for purposes of understanding the apparatus of my invention, the operation of the directional coupler illustrated in FIG. 1 in response to a signal applied to port *a* will be briefly described. Referring to FIG. 2, the directional coupler 9 of FIG. 1 has been shown with its ports *a*, *b*, *c* and *d* each terminated in the characteristic impedance Z, and an input signal V applied to port *a*. The windings 11 and 13 each have an inductance $L_1$, and the windings 15 and 17 each have an inductance $L_2$. Unity coupling coefficients are assumed for each of the transformers T1 and T2, so that the mutual inductance for each transformer is $M=\sqrt{L_1L_2}$. In terms of the currents $i_1$, $i_2$, $i_3$ and $i_4$ shown in the drawings, and a parameter $s=j\omega$, the equations relating the currents to the signal voltage V may be expressed as:

1. $i_1(2Z_o+sL_1)-i_2Z-i_3Sm=V$
2. $-i_1Z_o+i_2(Z_o+sL_2)-i_4sM=0$
3. $-i_1sM+i_3(Z_o+sL_2)+i_4Z_o=0$

4. $-i_2sM+i_3Z_0+i_4(2Z_0+sL_1)=0$

Solving these equations, one obtains:

$$i_1=\frac{V(Z_0+sL_2)}{Z_0(Z_0+sL_1+2sL_2)} \qquad i_3=\frac{+VsM}{Z_0(Z_0+sL_1+2sL_2)}$$

$$i_2=\frac{V}{(Z_0+sL_1+2sL_2)} \qquad i_4=0$$

The current $i_a$ into port $a$, and the currents $i_b$, $i_c$ and $i_d$ out of ports $b$, $c$ and $d$, are given by:

$$i_a=\frac{V(Z_0+sL_2)}{Z_0(Z_0+sL_1+2sL_2)} \qquad i_b=\frac{VsL_2}{Z_0(Z_0+sL_1+2sL_2)}$$

$$i_c=0 \qquad i_d=\frac{-VsM}{Z_0(Z_0+sL_1+2sL_2)}$$

At frequencies high enough so that $\omega L_2 \gg Z_0$, these currents become approximately:

$$i_a=\frac{VL_2}{Z_0(L_1+2L_2)} \qquad i_b=\frac{VL_2}{Z(L_1+2L_2)}$$

$$i_c=0 \qquad i_d=\frac{VM}{Z(L_1+2L_2)}$$

The corresponding voltages are:

$$V_a=\frac{V(L_1+L_2)}{L_1+2L_2} \qquad V_b=\frac{VL_2}{L_1+2L_2}$$

$$V_c=0 \qquad V_d=\frac{-VM}{L_1+2L_2}$$

The amplifier 7 is required, for the reasons discussed above, to have an input impedance equal to the characteristic impedance of the coupler between its terminal *a* and ground, and an output impedance between its output terminal *b* and ground that is also the coupler characteristic impedance. In the circuit shown, those conditions are attained by means of internal feedback, in combination with an autotransformer, in a manner next to be described.

The amplifier 7 includes an NPN-transistor Q1 which may be, for example, an RCA type 2N5109. Operating bias is supplied from a suitable DC source having a terminal at a potential B+ through an autotransformer L1 connected to the collector of the transistor Q1. The emitter of the transistor Q1 is returned to ground through a pair of resistors R1 and R2 in series. The base of the transistor Q1 is returned to ground through a resistor R3. A feedback resistor R4 is connected between the base and the collector of the transistor Q1. As shown, a filter capacitor C1 is connected between the supply terminal at B+ and ground, and a bypass capacitor C2 is connected across the resistor R2.

The input signal is supplied to the amplifier through a coupling capacitor C3. The output signal is supplied through a coupling capacitor C4, connected between a tap on the autotransformer L1 and the output terminal *b*.

The resistors R2, R3 and R4 are preferably selected for Class A operation of the amplifier. The value of resistor R4, in addition to being selected for biasing, is also selected in conjunction with resistor R1, to provide negative feedback for the purposes of adjusting the input and output impedances of the amplifier to a desired value. Increasing values of the resistor R1 tend to increase the input impedance. The resistor R4 tends to reduce both the input and output impedances with decreasing values. The tap on the autotransformer $L_1$ is selected to further reduce the output impedance of the amplifier to match the characteristic impedance of the directional coupler. Typically a 50 ohm impedance can be obtained on a range from 2 MHz. to 32 MHz., with a voltage-standing wave ratio of 1.2:1. The feedback discussed above provided by resistors R1 and R4 is the minimum necessary to provide the desired input and output impedances.

The principal feedback around the amplifier 7 is provided by the coupling, without phase shift, between the ports *c* and *b* of the directional coupler and this feedback is nonenergy dissipative. The input port *a* is unaffected by the amplifier output, because port *c* is isolated from port *a* as described above. The amplified signal appearing at port *c* is substantially directly coupled to the load at port *d* without phase shift.

Figure 3:
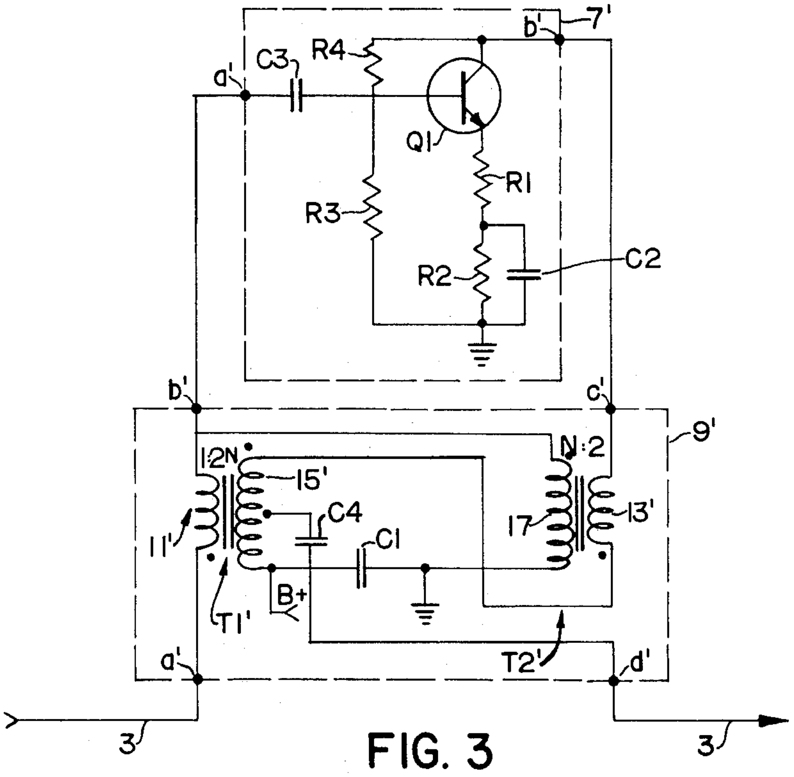
FIG. 3 is a schematic diagram of a second embodiment of the amplifier of my invention.

FIG. 3 shows a modification of the apparatus of my invention in which the autotransformer L1 can be omitted with a resulting simplification of the apparatus. The functions of the amplifier 7 and the directional coupler 9 of FIG. 2 are essentially retained, but the impedance matching function is shared between them. In general, regarding the amplifier as that portion shown within the block 7' in FIG. 3 and the directional coupler as that shown within the dotted line 9', the basic distinction between the circuit in FIG. 3 and the circuit in FIG. 1 is that in FIG. 3 the port *c'* of the directional coupler is required to be terminated in a 200 ohm impedance if ports *a'*, *b' and d'* are each terminated in a 50 ohm impedance. The corresponding input impedance of the amplifier 7' must still be 50 ohms, but the output impedance may be increased to 200 ohms. In essence, these changes are effected by incorporating the autotransformer L1 of FIG. 1 as a portion of the secondary winding 15' of the transformer T1' in FIG. 3. The supply voltage terminal B= is connected to the lower end of this winding 15', and the bypass capacitor C1 completes the AC circuit between the lower end of the winding 15' and ground.

The coupling capacitor C4 is now connected between a center tap on the winding 15' and the active terminal of the output port *d'*. If the transformers T1 and T2 of FIG. 1 have turns ratios of N:1, then the transformer T1' of FIG. 3 should have a ratio of 2N:1, the winding 15' of T1' having the larger number of turns and the transformer T2' should have a ratio of N:2, the winding 17' of T2' having the larger number of turns. The necessary adjustment of the amplifier 7' to complete the impedance match may be made by appropriate selection of the values of the resistors R1 and R4.

Figure 4:
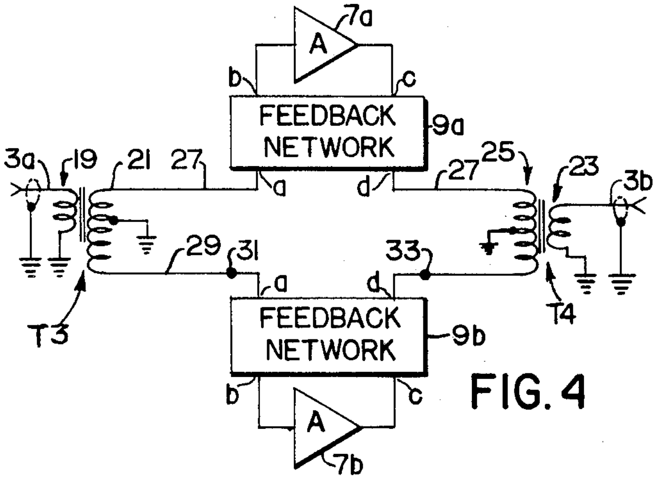
FIG. 4 is a block and line diagram of an amplifying network in accordance with another modification of my invention.

FIG. 4 illustrates an embodiment of the invention in which distortion products may be reduced and power-handling capability increased by the use of a pair of amplifying networks, in parallel. As shown, the signal source supplies the winding 19 of the transformer T3 and the load is supplied from the winding 23 of the transformer T4. The transformer T3 has a primary winding 19 having a $1:\sqrt{2}$ turns ratio to its secondary winding 21, and the transformer T4 has a primary winding 23 with a $1:\sqrt{2}$ turns ratio to its secondary winding 25. The transformers T3 and T4 each have their secondary windings center-tapped to ground, and thereby convert the unbalanced primary circuit to a balanced secondary circuit, and also transform the input impedance Z to provide correct source impedance for each amplifier circuit. Similarly the output impedance of each amplifier is correctly matched to the load.

The lead 27 is connected to an inverting amplifier **7*a* through the feedback network 9*a*, and the lead 29 is connected to an inverting amplifier 7*b* through a feedback network 9*b***. Each of these amplifying networks comprising an inverting amplifier and a feedback network may be the same as described above in connection with either FIG. 1 or FIG. 3. With the arrangement shown, the even distortion products are cancelled.

Figure 5:
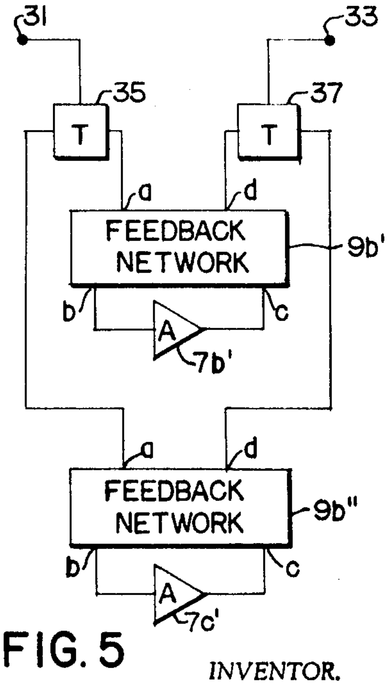
FIG. 5 is a block and line diagram of a modification of the apparatus of FIG. 4.

FIG. 5 illustrates the manner in which still further improvement in higher order harmonic distortion suppression can be attained by the use of additional amplifying networks in parallel. The terminals 31 and 33 in FIG. 5 correspond to the same terminals in FIG. 4, and illustrate the manner in which a single network such as that comprising the feedback network **9*b* and amplifier 7*b* of FIG. 4 can be replaced by two amplifying networks, one including a feedback network 9*b'* and amplifier 7*b'*, and a second one comprising a feedback network 9*b''*, and an amplifier 7*c'*. Power division to the input ports of these networks is provided by a conventional hybrid junction 35. Power addition to the output line is accomplished by a hybrid junction 37** having its collateral ports connected to the ports *d* of the directional couplers **9*b'* and 9*b''*, and its output port connected to the output terminal 33**.

The construction of FIG. 5, applied to both sides of the circuit of FIG. 4, could be arranged to divide power amplification between four amplifying networks in parallel. Alternatively, the terminals 31 and 33 in FIG. 5 could be coupled directly to the source and load respectively, thereby eliminating the need for the transformers T3 and T4 in FIG. 4 and their functions. However, the circuit of FIG. 5 would not provide for the cancellation of even distortion products if used alone as does FIG. 4.

As so far described, the amplifier associated with the directional coupler feedback network has been described as an inverting amplifier. A noninverting amplifier may also be used with the same directional coupler feedback network by suitably interchanging the connection between the amplifier and the coupler. I have schematically indicated the connections when a noninverting amplifier is used with the directional coupler of FIG. 1 in FIG. 6.

Figure 6:
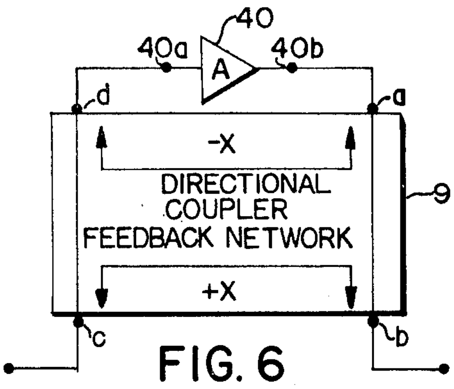
FIG. 6 is a block and line diagram of an embodiment of my invention used as a noninverting amplifier.

The coupling between ports *a* and *d* and *b* and *c* of the directional coupler feedback network of FIG. 1 is illustrated in FIG. 6 by the use of a coupling coefficient and associated arrow to indicate direction. Thus, power supplied to port *a* is coupled to port *d* with inverted phase and attenuated by X. Similarly power is coupled from port *c* to port *b* and attenuated by X but is not inverted in phase.

If the amplifier 40 in FIG. 6 is of the type described above but because of its internal construction is noninverting, the directional coupler described can be used to provide a feedback network for this amplifier by connecting the input terminal 40*a* of the amplifier 40 to the port *d* of the directional coupler and the output terminal 40*b* to the port *a* of the directional coupler. The input terminal of the amplifier network is then the port *c* and the output terminal the port *b*. It is thus apparent the directional coupler described may be used to provide a feedback network around either an inverting or noninverting amplifier.

While I have described my invention with reference to the details of various illustrative embodiments thereof, many changes and variations will be apparent to those skilled in the art upon reading my description, and such can obviously be made without departing from the scope of my invention.

Having thus described my invention, what I claim is:

1. A high-dynamic-range radiofrequency amplifier for amplifying an applied input signal to produce at an output terminal an amplified signal comprising, a. a radiofrequency amplifier circuit having an input terminal and an output terminal;

b. a nondissipative dual directional coupler having four ports *a*, *b*, *c* and *d*, wherein ports *a* and *c* are mutually isolated and ports *b* and *d* are mutually isolated, and wherein:

port *a* is connected to port *b* such that a major portion of electrical energy applied to port *a* is transmitted to port *b* and vice versa; port *a* is mutually coupled to port *d* with a predetermined coupling factor and phase relation; and wherein, port *c* is connected to port *d* such that a major portion of electrical energy applied to port *c* is transmitted to port *d* and vice versa; port *c* is mutually coupled to port *b* with a predetermined coupling factor and phase relation, the phase relation between one pair of said mutually coupled ports being substantially 0° and the phase relation between the said other pair being substantially 180°;

c. means for supplying the input signal directly to said *a* port; said amplifier input terminal being connected directly to said *b* port, the output terminal of said amplifier being connected directly to said *c* port, the phase relation between said *b* and *c* ports being such that a negative feedback path for said amplifier is formed by said directional coupler, said amplified output signal being produced at said *d* port.

2. The combination defined in claim 1 in which the *c* port has a characteristic impedance which differs from that of the remainder of said ports and wherein said coupler includes impedance-transforming means.

3. The combination defined in claim 1 in which said coupler has a characteristic impedance Z and said amplifier circuit has equal input and output impedances, said input and output impedances being equal to Z.

4. The combination defined in claim 1 in which said amplifier circuit is an inverting amplifier and the attenuated coupling between said *b* and *c* ports is in phase.

5. The combination defined in claim 1 in which said amplifier circuit is a noninverting amplifier and the attenuated coupling between said *b* and *c* ports is 180° out of phase.

6. The apparatus of claim 1 in which said directional coupler comprises a first transformer having a primary winding coupling ports *a* and *b* and a secondary winding coupled to port *d*, and a second transformer having a primary winding coupling ports *c* and *d* and a secondary winding coupled to port *b*.

7. The apparatus of claim 1 in which said directional coupler comprises a first transformer having a primary winding coupling ports *a* and *b* and a secondary winding, and a second transformer having a secondary winding coupled to port *b* and a primary winding, the secondary winding of said first transformer and the primary winding of said second transformer being connected in series and coupled to port *c*, and means coupling half of the secondary winding of said first transformer to port *d*.

* * * * *